(12) United States Patent
Mandegaran

(10) Patent No.: US 9,762,416 B2
(45) Date of Patent: Sep. 12, 2017

(54) REFLECTION COEFFICIENT READER

(71) Applicant: Abtum Inc., Irvine, CA (US)

(72) Inventor: Sam Mandegaran, Pasadena, CA (US)

(73) Assignee: Abtum Inc., Irvine, CA (US)

( * ) Notice: Subject to any disclaimer, the term of this patent is extended or adjusted under 35 U.S.C. 154(b) by 0 days.

(21) Appl. No.: 15/220,068

(22) Filed: Jul. 26, 2016

(65) Prior Publication Data

US 2017/0070368 A1   Mar. 9, 2017

Related U.S. Application Data

(60) Provisional application No. 62/215,462, filed on Sep. 8, 2015.

(51) Int. Cl.
| | |
|---|---|
| *H04B 1/38* | (2015.01) |
| *H04L 7/00* | (2006.01) |
| *H04L 25/03* | (2006.01) |
| *H01Q 15/14* | (2006.01) |
| *H01Q 1/24* | (2006.01) |
| *H01Q 9/04* | (2006.01) |
| *H04B 1/04* | (2006.01) |

(52) U.S. Cl.
CPC ....... *H04L 25/03019* (2013.01); *H01Q 1/243* (2013.01); *H01Q 9/0442* (2013.01); *H01Q 15/14* (2013.01); *H04B 2001/0408* (2013.01)

(58) Field of Classification Search
USPC .......... 375/219, 220, 221, 222, 240, 240.26, 375/240.27, 240.29, 240.02, 254, 257, 375/258, 259, 285, 284, 278, 295, 297, 375/316, 318, 324, 346, 350, 352, 326, 375/354, 358, 356, 355

See application file for complete search history.

(56) References Cited

U.S. PATENT DOCUMENTS

| | | |
|---|---|---|
| 2,561,212 A | 7/1951 | Lewis |
| 3,025,463 A | 3/1962 | Luoma et al. |
| 3,453,638 A | 7/1969 | Hoovler |
| 3,704,409 A | 11/1972 | Oomen |
| 3,800,218 A | 3/1974 | Shekel |
| 4,029,902 A | 6/1977 | Bell et al. |
| 4,146,851 A | 3/1979 | Dempsey et al. |

(Continued)

FOREIGN PATENT DOCUMENTS

| | | |
|---|---|---|
| DE | 102012107877 A1 | 2/2014 |
| EP | 1091497 A1 | 4/2001 |

(Continued)

OTHER PUBLICATIONS

EESR for European Appl. No. 13876497.2, dated Jul. 4, 2016.

(Continued)

*Primary Examiner* — Linda Wong
(74) *Attorney, Agent, or Firm* — McAndrews, Held & Malloy, Ltd.

(57) ABSTRACT

The disclosure provides circuitry and methods to determine the reflection coefficient of a transmission line connected another physical element or device such as an antenna. The outgoing and the reflected signals on the transmission line are compared using two separate paths, with one path going through a signal conditioning circuitry such as an equalizer. The two paths are then combined and detected. A lookup table may be used for non-linear responses.

13 Claims, 11 Drawing Sheets

(56) References Cited

U.S. PATENT DOCUMENTS

| | | |
|---|---|---|
| 4,427,936 A | 1/1984 | Riblet et al. |
| 4,464,675 A | 8/1984 | Balaban et al. |
| 4,489,271 A | 12/1984 | Riblet |
| 4,694,266 A | 9/1987 | Wright |
| 4,721,901 A | 1/1988 | Ashley |
| 4,963,945 A | 10/1990 | Cooper et al. |
| 4,968,967 A | 11/1990 | Stove |
| 5,408,690 A | 4/1995 | Ishikawa et al. |
| 5,493,246 A | 2/1996 | Anderson |
| 5,525,945 A | 6/1996 | Chiappetta et al. |
| 5,574,400 A * | 11/1996 | Fukuchi ............... H03F 1/3235 330/151 |
| 5,691,978 A | 11/1997 | Kenworthy |
| 5,781,084 A | 7/1998 | Rhodes |
| 6,178,310 B1 | 1/2001 | Jeong |
| 6,194,980 B1 | 2/2001 | Thon |
| 6,229,992 B1 | 5/2001 | McGeehan et al. |
| 6,262,637 B1 | 7/2001 | Bradley et al. |
| 6,297,711 B1 | 10/2001 | Seward et al. |
| 6,496,061 B1 | 12/2002 | Bloom |
| 6,721,544 B1 | 4/2004 | Franca-Neto |
| 6,819,302 B2 | 11/2004 | Volman |
| 7,072,614 B1 | 7/2006 | Kasperkovitz |
| 7,116,966 B2 | 10/2006 | Hattori et al. |
| 7,123,883 B2 | 10/2006 | Mages |
| 7,250,830 B2 | 7/2007 | Layne et al. |
| 7,330,500 B2 | 2/2008 | Kouki |
| 7,623,005 B2 | 11/2009 | Johansson et al. |
| 7,633,435 B2 | 12/2009 | Meharry et al. |
| 7,711,329 B2 | 5/2010 | Aparin et al. |
| 7,804,383 B2 | 9/2010 | Volatier et al. |
| 7,894,779 B2 | 2/2011 | Meiyappan et al. |
| 8,013,690 B2 | 9/2011 | Miyashiro |
| 8,135,348 B2 | 3/2012 | Aparin |
| 8,149,742 B1 | 4/2012 | Sorsby |
| 8,199,681 B2 | 6/2012 | Zinser et al. |
| 8,385,871 B2 | 2/2013 | Wyville |
| 8,422,412 B2 * | 4/2013 | Hahn ............... H04B 1/525 370/286 |
| 8,514,035 B2 | 8/2013 | Mikhemar et al. |
| 8,600,329 B1 | 12/2013 | Comeau et al. |
| 8,620,246 B2 | 12/2013 | McKinzie et al. |
| 8,749,321 B2 | 6/2014 | Kim et al. |
| 8,761,026 B1 | 6/2014 | Berry et al. |
| 8,957,742 B2 | 2/2015 | Spears et al. |
| 9,048,805 B2 | 6/2015 | Granger-Jones et al. |
| 9,214,718 B2 | 12/2015 | Mow et al. |
| 9,450,553 B2 | 9/2016 | Langer et al. |
| 9,490,866 B2 | 11/2016 | Goel et al. |
| 9,543,630 B2 | 1/2017 | Tokumitsu et al. |
| 9,590,794 B2 | 3/2017 | Analui et al. |
| 2002/0089396 A1 | 7/2002 | Noguchi et al. |
| 2003/0109077 A1 | 6/2003 | Kim et al. |
| 2004/0000425 A1 | 1/2004 | White et al. |
| 2004/0127178 A1 | 7/2004 | Kuffner |
| 2004/0180633 A1 | 9/2004 | Nakatani et al. |
| 2005/0070232 A1 | 3/2005 | Mages |
| 2005/0245213 A1 * | 11/2005 | Hirano ............... H03F 1/0205 455/127.1 |
| 2005/0289632 A1 | 12/2005 | Brooks |
| 2006/0019611 A1 | 1/2006 | Mages |
| 2006/0264174 A1 * | 11/2006 | Moss ............... H04B 1/525 455/16 |
| 2007/0105509 A1 | 5/2007 | Muhammad |
| 2008/0128901 A1 | 6/2008 | Zurcher et al. |
| 2008/0227409 A1 | 9/2008 | Chang et al. |
| 2008/0240000 A1 | 10/2008 | Kidd |
| 2008/0261519 A1 | 10/2008 | Demarco et al. |
| 2009/0054008 A1 | 2/2009 | Satou |
| 2009/0121797 A1 | 5/2009 | Karabatsos |
| 2009/0125253 A1 | 5/2009 | Blair et al. |
| 2009/0252252 A1 | 10/2009 | Kim et al. |
| 2009/0253385 A1 | 10/2009 | Dent et al. |
| 2009/0289744 A1 | 11/2009 | Miyashiro |
| 2010/0002620 A1 | 1/2010 | Proctor et al. |
| 2010/0084146 A1 | 4/2010 | Roberts |
| 2010/0109771 A1 * | 5/2010 | Baik ............... H04B 7/15585 330/149 |
| 2010/0127795 A1 | 5/2010 | Bauer et al. |
| 2010/0134700 A1 | 6/2010 | Robert et al. |
| 2020/0148886 | 6/2010 | Inoue et al. |
| 2010/0177917 A1 | 7/2010 | Van Der Werf |
| 2010/0323654 A1 | 12/2010 | Judson et al. |
| 2010/0328125 A1 * | 12/2010 | Pagnanelli ............ H03M 3/468 341/143 |
| 2011/0069644 A1 | 3/2011 | Kim et al. |
| 2011/0080229 A1 | 4/2011 | Kennington |
| 2011/0080856 A1 | 4/2011 | Kenington |
| 2011/0085477 A1 * | 4/2011 | Schiff ............... H04B 7/15585 370/279 |
| 2011/0116403 A1 * | 5/2011 | Kahrizi ............... H04B 1/0475 370/252 |
| 2011/0134810 A1 | 6/2011 | Yamamoto et al. |
| 2011/0140803 A1 | 6/2011 | Kim et al. |
| 2011/0227664 A1 | 9/2011 | Wyville |
| 2011/0256857 A1 * | 10/2011 | Chen ............... H04B 1/525 455/422.1 |
| 2012/0007605 A1 | 1/2012 | Benedikt |
| 2012/0063496 A1 | 3/2012 | Giannini et al. |
| 2012/0075069 A1 | 3/2012 | Dickey et al. |
| 2012/0140860 A1 | 6/2012 | Rimini et al. |
| 2012/0154071 A1 | 6/2012 | Bradley et al. |
| 2012/0161784 A1 | 6/2012 | Benedikt |
| 2012/0163245 A1 | 6/2012 | Tone et al. |
| 2012/0194269 A1 | 8/2012 | Schlager |
| 2012/0201153 A1 | 8/2012 | Bharadia et al. |
| 2012/0201173 A1 | 8/2012 | Jain et al. |
| 2012/0212304 A1 | 8/2012 | Zhang et al. |
| 2012/0230227 A1 | 9/2012 | Weiss |
| 2013/0016634 A1 | 1/2013 | Smiley |
| 2013/0063299 A1 | 3/2013 | Proudkii |
| 2013/0065542 A1 * | 3/2013 | Proudkii ............ H03H 11/1291 455/78 |
| 2013/0079641 A1 * | 3/2013 | Zwirn ............... A61B 5/0095 600/447 |
| 2013/0083703 A1 | 4/2013 | Granger-Jones et al. |
| 2013/0109330 A1 | 5/2013 | Sahota et al. |
| 2013/0113576 A1 | 5/2013 | Inoue et al. |
| 2013/0114651 A1 * | 5/2013 | Ranson ............... H04B 7/15 375/214 |
| 2013/0130619 A1 | 5/2013 | Harverson et al. |
| 2013/0154887 A1 | 6/2013 | Hein et al. |
| 2013/0201880 A1 | 8/2013 | Bauder et al. |
| 2013/0201881 A1 | 8/2013 | Bauder et al. |
| 2013/0201882 A1 | 8/2013 | Bauder et al. |
| 2013/0222059 A1 * | 8/2013 | Kilambi ............... H04B 1/0475 330/149 |
| 2013/0241655 A1 | 9/2013 | Liss et al. |
| 2013/0241669 A1 | 9/2013 | Mikhemar et al. |
| 2013/0242809 A1 | 9/2013 | Tone et al. |
| 2013/0245976 A1 | 9/2013 | Hind |
| 2013/0301488 A1 * | 11/2013 | Hong ............... H04B 1/56 370/278 |
| 2013/0321097 A1 | 12/2013 | Khlat et al. |
| 2014/0103946 A1 * | 4/2014 | Vanden Bossche ........... G01R 31/2822 324/750.01 |
| 2014/0169236 A1 | 6/2014 | Choi et al. |
| 2014/0194073 A1 | 7/2014 | Wyville et al. |
| 2014/0204808 A1 | 7/2014 | Choi et al. |
| 2014/0376419 A1 | 12/2014 | Goel et al. |
| 2015/0049841 A1 * | 2/2015 | Laporte ............... H03F 1/3247 375/297 |
| 2015/0118978 A1 | 4/2015 | Khlat |
| 2015/0163044 A1 | 6/2015 | Analui et al. |
| 2015/0236390 A1 | 8/2015 | Analui et al. |
| 2015/0236395 A1 | 8/2015 | Analui et al. |
| 2015/0236842 A1 | 8/2015 | Goel et al. |
| 2015/0249556 A1 * | 9/2015 | He ............... H04L 7/0062 375/233 |
| 2016/0050031 A1 * | 2/2016 | Hwang ............... H04B 1/525 375/219 |

(56) References Cited

U.S. PATENT DOCUMENTS

| | | | | |
|---|---|---|---|---|
| 2016/0134325 | A1* | 5/2016 | Tageman | H04B 1/525 455/83 |
| 2016/0204821 | A1 | 7/2016 | Han et al. | |
| 2016/0211870 | A1 | 7/2016 | Wu et al. | |
| 2016/0380706 | A1* | 12/2016 | Tanzi | H04B 1/123 455/78 |
| 2017/0070368 | A1 | 3/2017 | Mandegaran | |

FOREIGN PATENT DOCUMENTS

| | | | |
|---|---|---|---|
| EP | 2733855 | A1 | 5/2014 |
| EP | 2814172 | A1 | 12/2014 |
| EP | 2960981 | A1 | 12/2015 |
| KR | 10-2010-0134324 | A | 12/2010 |
| WO | 9515018 | A1 | 6/1995 |
| WO | 2014032883 | A1 | 3/2014 |
| WO | 2014133625 | A2 | 9/2014 |
| WO | 2015089091 | A1 | 6/2015 |
| WO | 2016063108 | A1 | 4/2016 |

OTHER PUBLICATIONS

Office Action for U.S. Appl. No. 14/626,572, dated Jul. 15, 2016.
Office Action for U.S. Appl. No. 14/622,627, dated May 20, 2016.
Office Action for U.S. Appl. No. 14/626,572, dated Mar. 31, 2016.
ISR for Application No. PCT/US2016/050466, dated Nov. 29, 2016.
Office Action for U.S. Appl. No. 14/626,572, dated Jul. 29, 2015.
ISR and Written Opinion for PCT Application No. PCT/US2015/016642, dated Jun. 25, 2015.
Hunter et al., "Passive Microwave Receive Filter Networks Using Low-Q Resonators," IEEE Microwave Magazine, pp. 46-53, (2005).
Laforge et al., "Diplexer design implementing highly miniaturized multilayer superconducting hybrids and filters," IEEE Transactions on Applied Superconductivity, pp. 47-54, (2009).
Marcatili et al., "Band-Splitting Filter," Bell System Technical Journal, pp. 197-212, (1961).
Matthaei et al., "Microwave Filters, Impedance-Matching Networks, and Coupling Structures," Chapter 14: Directional, Channel-Separation Filters and Traveling-WAve Ring-Resonators, pp. 843-887, Copyright 1980 Artech House, Inc., Dedham, MA; reprint of edition published by McGraw-Hill Book Company, 1964.
Matthaei et al., "Microwave Filters, Impedance-Matching Networks, and Coupling Structures," Chapter 16: Multiplexer Design, pp. 965-1000, Copyright 1980 Artech House, Inc., Dedham, MA; reprint of edition published by McGraw-Hill Book Company, 1964.
Phudpong et al., "Nonlinear Matched Reflection Mode and stop Filters for Frequency Selective Limiting Applications," Microwave Symposium Conference, IEEE/MTT-S International, pp. 1043-1046, (2007).
ISR and Written Opinion for PCT/US2014/069372, dated Mar. 3, 2015.
ISR and Written Opinion for PCT/US2015/016145, dated May 20, 2015.
ISR and Written Opinion for PCT/US2015/015930, dated May 27, 2015.
Korean International Searching Authority, ISR and Written Opinion for PCT/US2013/074155, dated Sep. 23, 2014.
Kannangara et al., "Analysis of an Adaptive Wideband Duplexer With Double-Loop Cancellation," IEEE Transactions on Vehicular Technology, vol. 56, No. 4, pp. 1761-1982, (2007).
Notice of Allowance for U.S. Appl. No. 14/102,244, dated Jul. 20, 2016.
Office Action for U.S. Appl. No. 14/102,244, dated Sep. 22, 2015.
Office Action for U.S. Appl. No. 14/102,244, dated Jun. 15, 2015.
ISR and Written Opinion for PCT/2016/054646, dated Dec. 29, 2016.

* cited by examiner

REFLECTION COEFFICIENT READER

CROSS-REFERENCE TO RELATED APPLICATIONS/INCORPORATION BY REFERENCE

This patent application makes reference to, claims priority to, and claims benefit from U.S. Provisional Application No. 62/215,462, filed on Sep. 8, 2015.

The above-identified application is hereby incorporated herein by reference in its entirety.

FIELD OF THE DISCLOSURE

Certain embodiments of the disclosure relate to electromagnetic components, integrated circuits, and wireless communication devices and systems. More specifically, certain embodiments of the disclosure relate to a method and system for a reflection coefficient reader.

BACKGROUND OF THE DISCLOSURE

With the recent explosion of the use of wireless devices, the demand for better performing devices is greater than ever. Cell phones, tablets, or other wireless devices can perform better by providing more computational power, higher uplink and downlink capacity, and more sensor capabilities, all without compromising battery life.

Battery life is directly related to the power consumption of the wireless device. One of the main power consumers in a wireless device is the power needed to transmit a signal. A power amplifier (PA) amplifies the outgoing signal to a desirable level and sends it to the antenna so it could be converted to electromagnetic waves.

The problem with all antennas especially in a hand held device is that they do not maintain constant impedance. The antenna characteristics, including its impedance, change as the antenna moves within an environment, gets close to different objects, etc. The change in the antenna impedance causes a mismatch between the antenna and the PA (or other blocks in the transmit path that interface with the antenna), which result in some of the outgoing signal to bounce back at the antenna. When this happens, a portion of the signal is not transmitted. This is wasted energy. To compensate for it, the wireless device may increase the power, which further increases power usage. In a worst scenario, so much of the signal is bounced back and so little is transmitted to the air that the communication may be disconnected. A combination of the reflected signal and the ongoing signal may also create an undesired standing wave. This standing wave may damage the circuit components such as the PA.

The undesired antenna mismatch may also have other undesired effects such as the leakage of a portion of the transmit signal to the receive path. This is specifically problematic in communication systems that support Simultaneous Transmit and Receive (STAR), Full Duplex (FD) communications, and radars.

Further limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

In an electronic circuit or system, for example, when two ports connect, it is often desirable to make the impedances of both ports match. This is especially true when the circuit operates at high enough speed where the wavelengths become comparable to the circuit paths. If there is a mismatch between the impedances of the two ports, a portion of the signal may be reflected. Sometimes the amount of reflection is so large that it is not acceptable.

Impedance mismatch can be problematic in wireless devices, for example, since the impedance of the antenna changes due to unpredictable environmental factors. As a wireless device moves in an environment and as it nears different objects, its effective antenna impedance often changes and can be far from the nominal impedance it was designed for. An impedance mismatch between two ports can be represented by a reflection coefficient which is a complex number having an amplitude and a phase.

Some embodiments of the disclosure determine the reflection coefficient of a circuit component or a circuit. For instance, some embodiments enable the determination of the impedance mismatch by finding the reflection coefficient. This information may be used in a system for various reasons including possible correction of the unwanted impedance mismatch. Some embodiments of the disclosure determine the complex value of the reflection coefficient including both the amplitude and the phase of the reflection coefficient. The reflection coefficient with a complex value is different from a reflection coefficient that only measures amplitude or in which the phase is always constant.

Some embodiments of the disclosure can provide better performance in wireless devices. Some embodiments can help a circuit that isolates the transmit signal from the receive signal and can further improve the uplink and downlink capacity. Some embodiments can help improve battery life by aiding an antenna tuner.

To improve performance, most cell-phones and other wireless devices isolate the receive signal path from the outgoing transmit signal. Many methods are used to accomplish this. Some devices use a circulator. Some devices use a duplexer. Practical circulators and duplexers are not perfect—they do not provide complete isolation between their ports. One may choose to further improve the isolation of transmit and receive signals by using feed-forward cancelation. When feed-forward cancelation is used, this disclosure can help improve the cancelation.

Some embodiments of this disclosure mitigate the loss from antenna mismatch by using an antenna tuner. The antenna tuner improves the match between the PA or the radio-frequency front-end module and the antenna. Generally, the antenna tuner is provided with information about the antenna mismatch. Some embodiments of this disclosure can help the antenna tuner by measuring (e.g., continuously, periodically, aperiodically, etc.) the reflection coefficient of the antenna or any part of the circuit it is placed. Some embodiments enable measuring the reflection coefficient (e.g., impedance) of any circuit component or network.

Various advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced

DETAILED DESCRIPTION OF THE DISCLOSURE

As utilized herein the terms "circuit" and "circuitry" refer to physical electronic components (i.e. hardware) and any software and/or firmware ("code") which may configure the hardware, be executed by the hardware, and/or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations.

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated.

Any represented simulation results of various embodiments are only for illustrative reasons, and are not meant to cover all possible responses that various embodiments enable. For instance, the presented simulation results cover filters with a single passband and at least one stopband (or notch) in their transfer functions. Filters with multiple passbands or stopbands may also be realized using the embodiments or other teachings of this disclosure. Filters whose transfer functions fundamentally change as a function of at least one stimulus may also be realized using the embodiments or other teachings of this disclosure.

Figure 1:
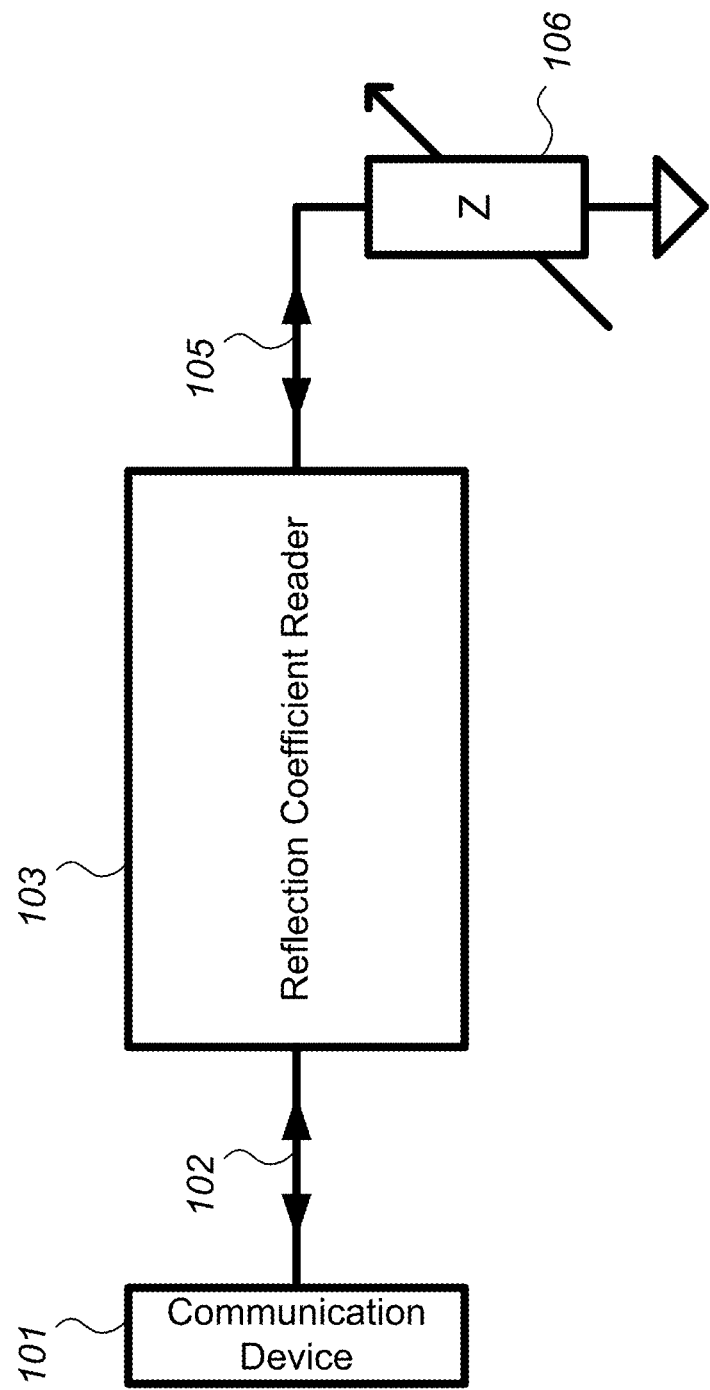
FIG. 1 illustrates the reflection coefficient reader in a system.

FIG. 1 illustrates the reflection coefficient reader 103 in a system. Without the reflection coefficient reader 103, the communication device 101 is connected directly to the variable impedance 106, thus paths 102 and 105 would be one path. As the impedance of the variable impedance 106 changes, the impedance mismatch between the communication device 101 and the variable impedance 106 changes which causes a reflection coefficient from the point of view of the communication device 101.

The reflection coefficient reader 103, as shown in FIG. 1, reads the reflection coefficient caused by the variable impedance 106. The variable impedance 106 may represent an actual circuit or an effective impedance of an electromagnetic device such as an antenna.

Figure 2A:
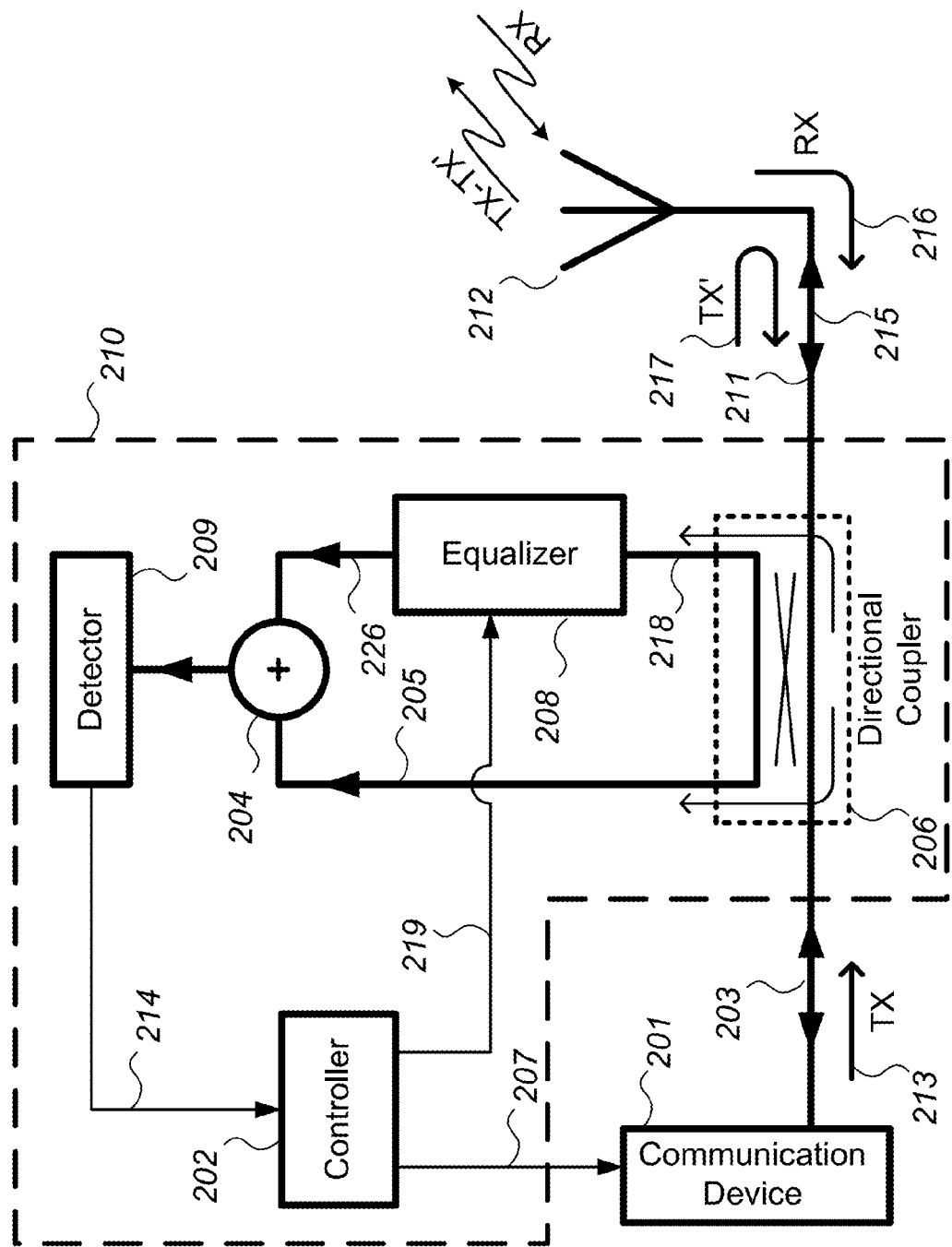
FIGS. 2A-2C illustrate a simplified block diagram of the reflection coefficient reader.

FIG. 2A illustrates the block diagram of the reflection coefficient reader. The reflection coefficient reader 210 is placed between a communication device 201 and a variable impedance which in this example is an antenna 212 used by the communication device 201.

A wireless communication device, such as a cell phone, WiFi device, or any radio, will have the device 201 connected directly to an antenna 212. In this configuration, a transmit signal TX 213 is sent out of the communication device 201 and to the antenna 212. If the antenna 212 is a perfect impedance match with the communication device 201, all of the signal will transmitted to air. Meanwhile, the antenna 212 will pick up incoming signal RX 216, and it will be directed to the communication device 201. In the real world, the impedance of antenna 212 is rarely a perfect or even a good match to that of the communication device 201 (or the transmission line that connects the two). This happens due to changes in the environment. An example is a cell phone moving through a room. As the cell phone nears or passes different objects in a room, the characteristic of the cell phone antenna changes which in return changes the impedance matching of the antenna with the rest of the cell phone circuitry. The change in the antenna's characteristics causes an impedance mismatch between the antenna and the circuit that connects to the antenna which in turn causes some of the transmit signal to reflect at the antenna 212 and return to the communication device 201. The amount of the transmit signal that is reflected is determined by the reflection coefficient of the antenna, $\Gamma$. Reflected signals can cause a myriad of problems, including, for example, power waste as some or much of the TX signal 213 is never transmitted to air.

FIG. 2A illustrates the basic function of the reflection coefficient reader 210. A directional coupler 206 picks up a portion of the outgoing and incoming signals. Because of the nature of directional couplers, the portion of the outgoing signal is sent to path 218 and the portion of the incoming signal is sent to path 205. The outgoing signal is mainly or only TX 213. The incoming signal 211 includes the receive signal RX 216 that is picked up by the antenna 212, and the reflected signal TX' 217 which is a portion of the TX signal 213 and is reflected by the antenna 212 due to impedance mismatch which is represented by reflection coefficient $\Gamma$.

The signal in path 218 is conditioned by signal conditioning circuitry, such as an equalizer 208, such that the resulting signal in path 226 cancels the signal in path 205. The cancelation is performed by circuit element 204, which can be a power combiner, voltage adder or subtracter, or any element that allows the combination of two or more signals and the output of the superposition of the signals.

The output of the signal combiner 204 is then fed to a detector 209. The detector 209 can be, for example, a power detector, a voltage detector, a current detector, or any other sort of detector that determines the signal strength.

FIG. 2A further illustrates the control system for the reflection coefficient reader 210. A controller 202 varies one or more features of the equalizer 208. For instance, it may vary the phase of a phase-shifter and the attenuation of a variable attenuator in the equalizer 208. The controller 202 then uses the information from the detector 209 to determine the reflection coefficient. The controller 202 may or may not use a lookup table to correct for any imperfections and non-linearity in the elements. Once the controller 202 determines the reflection coefficient, it sends this information to the communication device 201 or any other circuit that may need or use this information. The reflection coefficient reader 210 will continuously monitor and track the reflection coefficient. In an example embodiment, the controller 202 may comprise a digital circuit. In another example embodiment, the controller 202 may comprise both analog and digital circuits.

Figure 2C:
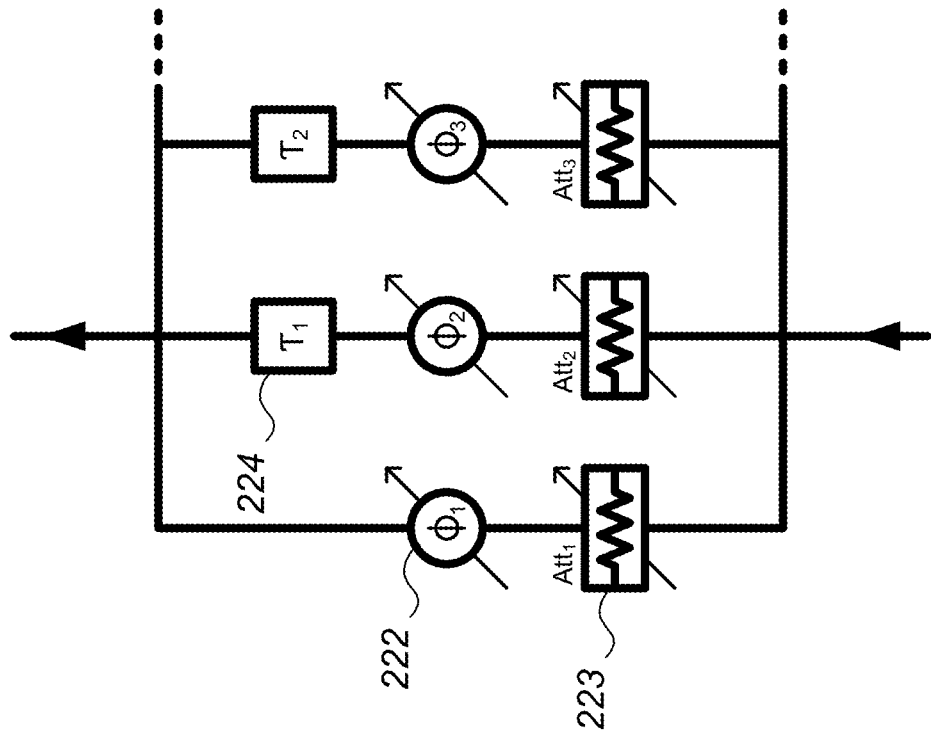
Figure 2B:
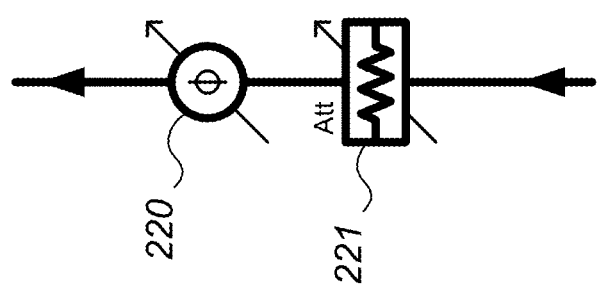

FIG. 2B illustrates one possible configuration for the equalizer 208. It comprises a variable attenuator 220 and a variable phase-shifter 221.

FIG. 2C illustrates another possible configuration for the equalizer 208. It comprises three or more parallel paths. Each path comprises a variable attenuator 222, a variable phase-shifter 223, and each path may or may not comprise a time delay 224.

The time delays may be a static time delay or a variable time delay. Time delays may correspond to effective group delays of circuitries at the frequencies of interest. One of more of the phase shift, the attenuation, and the time delay functions may be performed within the same circuitry. The number of parallel paths may depend on the desired frequencies or bandwidth of the equalizer.

Figure 3:
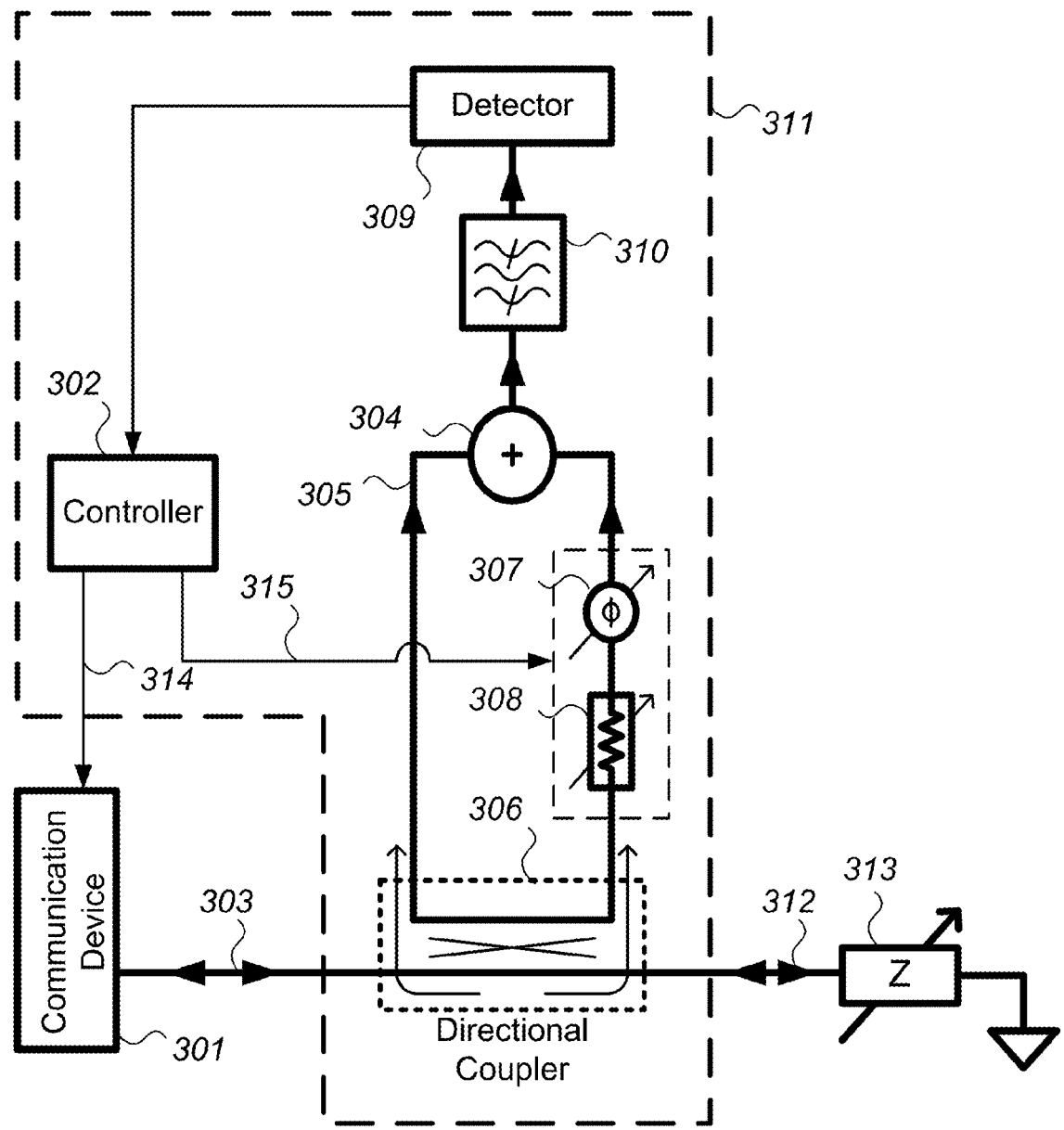
FIG. 3 illustrates a simplified block diagram of the reflection coefficient reader.

FIG. 3 illustrates another configuration for the reflection coefficient reader. A band pass filter 310 is placed between the combiner 304 and the detector 309. The detector may already comprise a filter of some sorts which might make the filter 310 unnecessary. The filter 310 can help narrow the bandwidth of the signal we are trying to cancel which may help the overall performance of the reflection coefficient reader 311. The equalizer in this example includes a variable phase shifter 307 and a variable attenuator 308.

Figure 4:
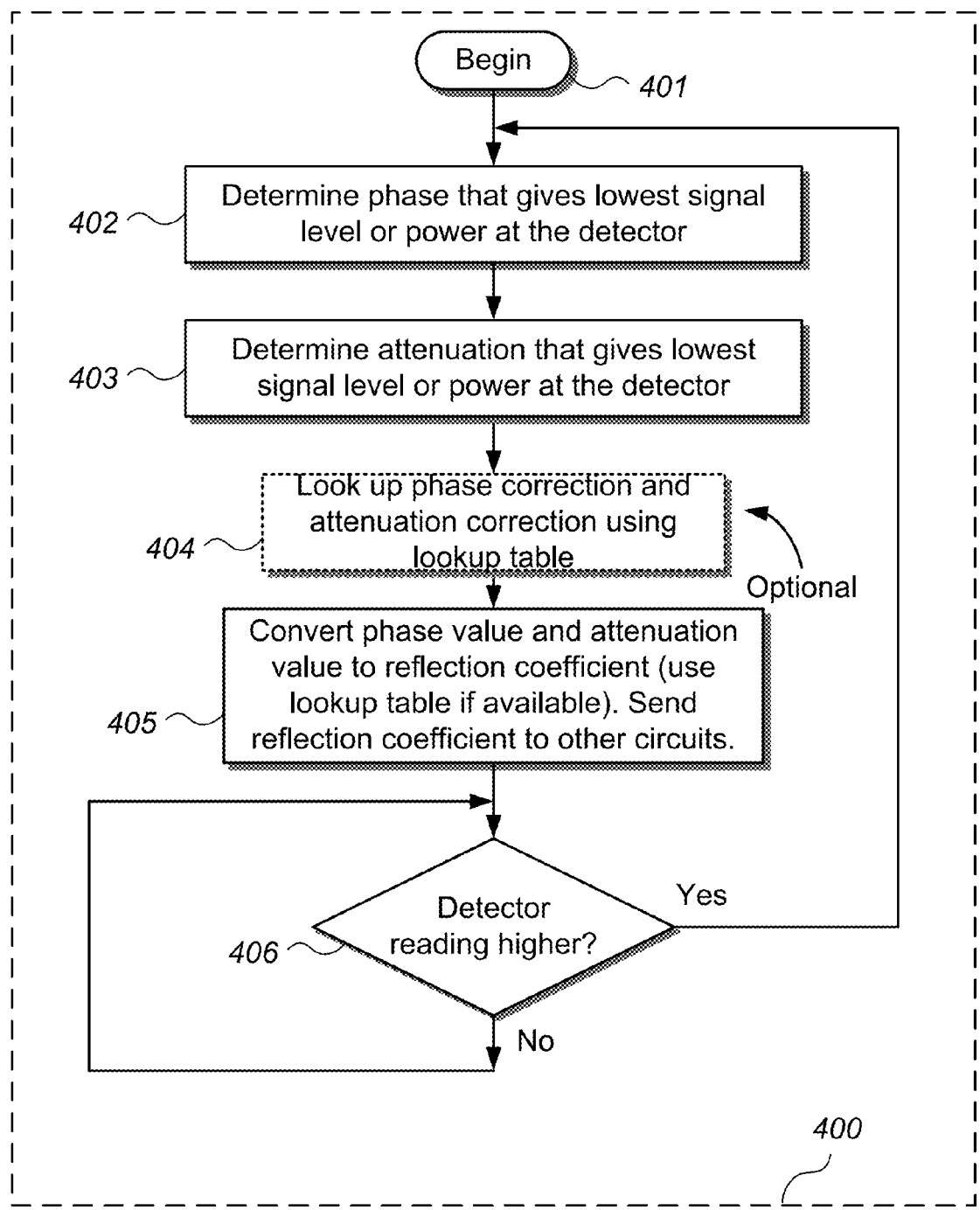
FIG. 4 illustrates a method to determine the reflection coefficient.

FIG. 4 illustrates a method 400 for determining or finding the reflection coefficient. This method may be run by a controller 202 (or 302). First, in step 402, it varies the phase of the phase-shifter 221 (or 223). It looks for a phase that gives the lowest or minimum level signal at detector 209 (or 309). It holds and stores the phase value. Then, in step 403, it varies the attenuation of the variable attenuator 220 (or 222) until it finds an attenuation that gives the lowest or minimum level signal at the detector 209 (or 309). It holds and stores the attenuation value.

Step 404 is optional. If the components, especially the directional coupler 206 (or 306), are fairly linear in the frequency or band of interest, step 404 might not be needed. In some cases, the non-ideality and non-linearity of the elements or devices may force the use of a lookup table (e.g., a lookup table 602 described with respect to FIG. 6). The lookup table can be part of the controller 202 (or 302) and can provide the controller 202 (or 302) with the error in phase and amplitude at any given setting. By doing so, the controller 202 (or 302) can provide a more accurate result for the reflection coefficient.

In step 405, the phase and the attenuation are held. The reflection coefficient Γ is determined using the current phase and attenuation values. If a lookup table is available, the lookup table is used to further correct the reflection coefficient Γ. The reflection coefficient Γ, which is two dimensional, phase and amplitude, is then sent to the communication device 201 (or 301) or any other circuit that might use this reflection coefficient Γ information.

In step 406, the detector 209 (or 309) is monitored. As long as the detector 209 (or 309) detects no rise or increase in signal strength or power, the controller 202 (or 302) does nothing. If the signal level or power at the detector 209 (or 309) increases, the reflection coefficient Γ changes and the reflection coefficient Γ should be determined, and the example steps may proceed back to step 402 to repeat the entire process.

Figure 5:
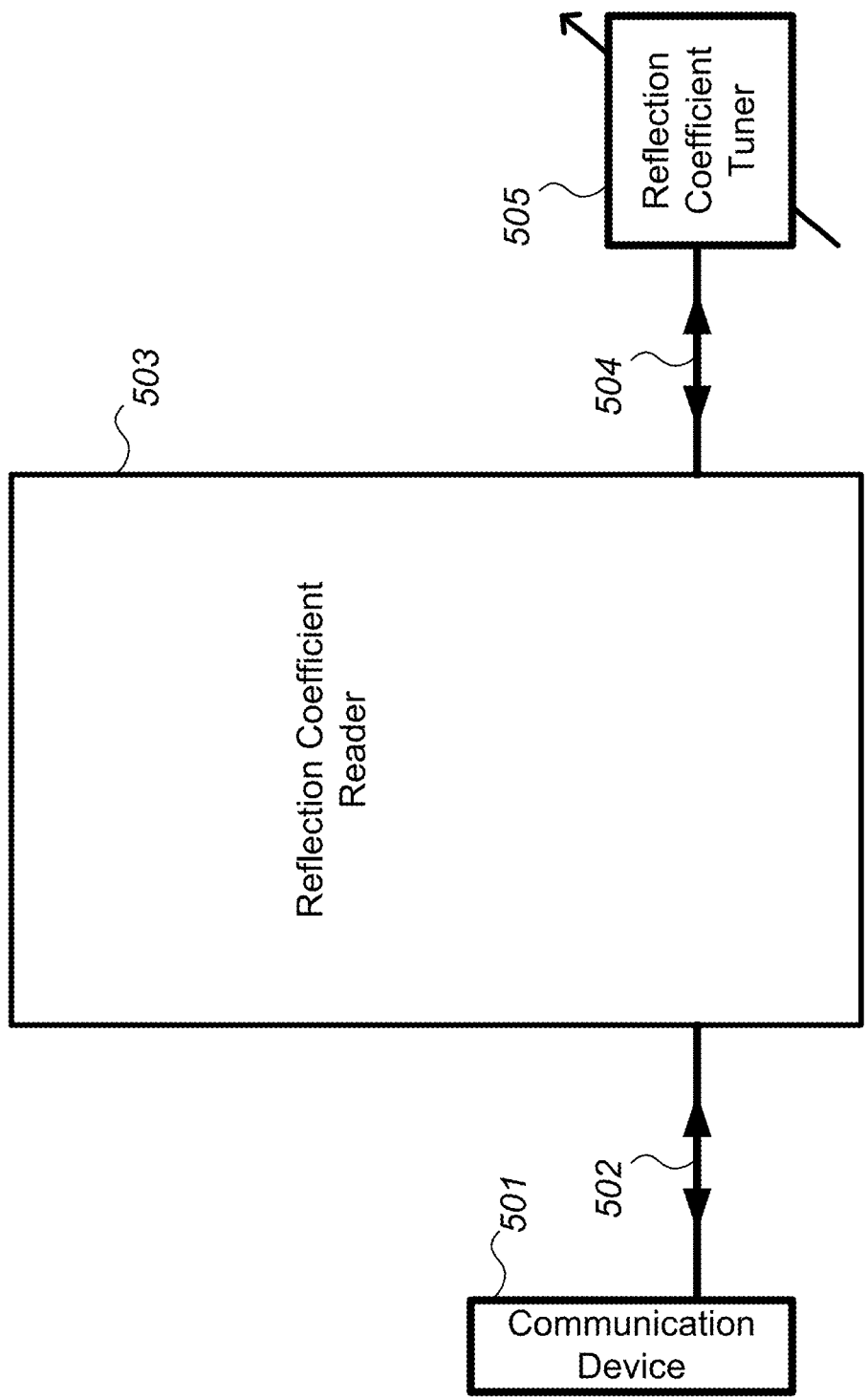
FIG. 5 illustrates a setup to determine the values in the lookup table.

FIG. 5 illustrates a method to evaluate and store the values in the lookup table. This can be a onetime process. Using a reflection coefficient tuner 505, such as a load-pull tuner, the reflection coefficient at the antenna side of the reflection coefficient reader 503 can be varied. The difference between the phase of the phase-shifter and the attenuation of the variable attenuator and the actual amplitude and phase of the reflection coefficient tuner can be stored for future corrections. The reflection coefficient tuner can be varied in small enough steps as needed. The reflection coefficient tuner can be varied to cover as large of an area of the Smith Chart as possible and/or needed for the intended application. The relevant area of the Smith Chart can be highly dependent on the antenna that is used with the system.

Figure 6:
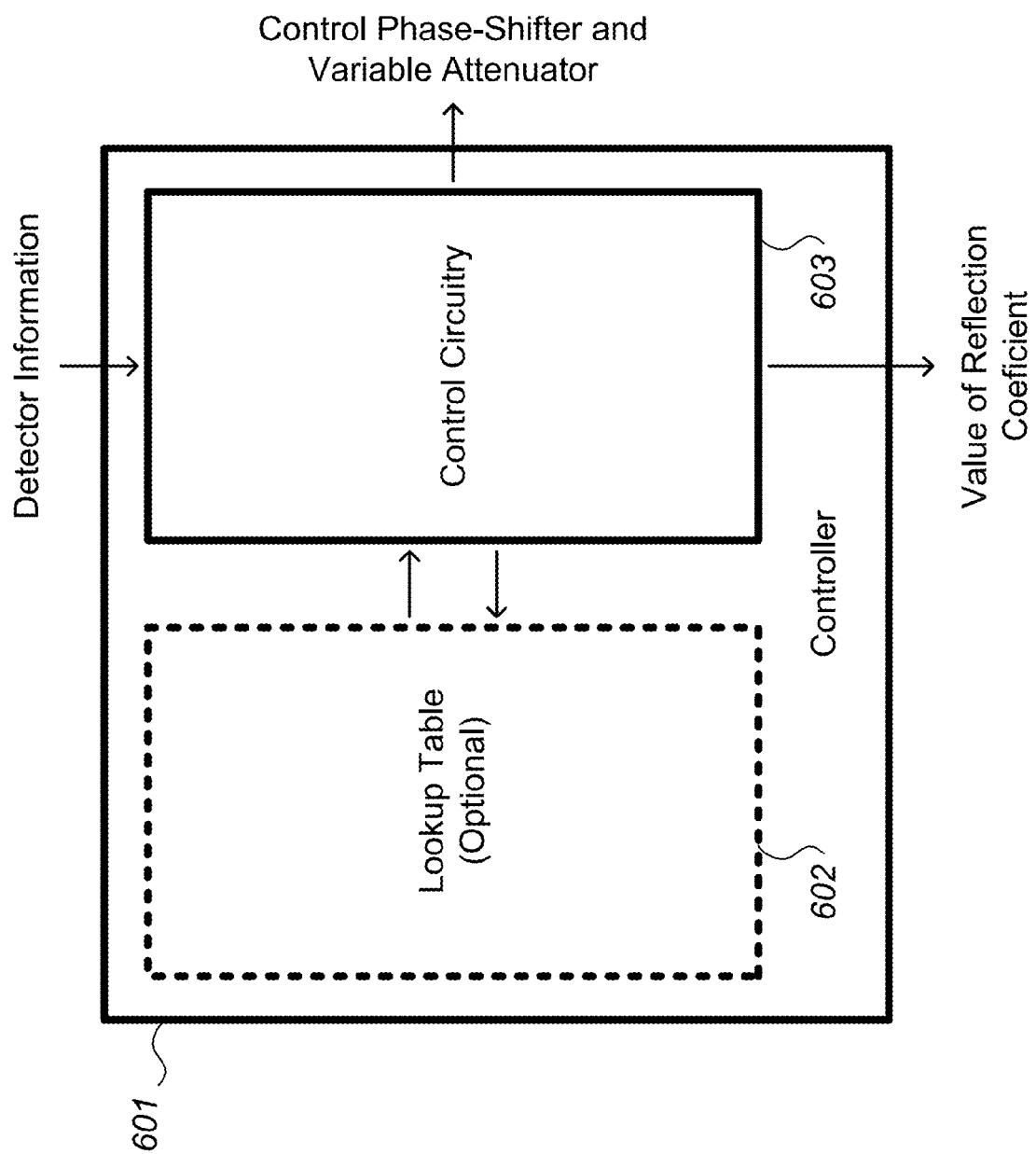
FIG. 6 illustrates a simplified block diagram of the controller.

FIG. 6 illustrates a block diagram of the controller. The controller 601 may or may not include a lookup table 602. If it includes a lookup table 602, the control circuitry 603 can use the information in the lookup table 602 to make better prediction of the value of the reflection coefficient.

Figure 7:
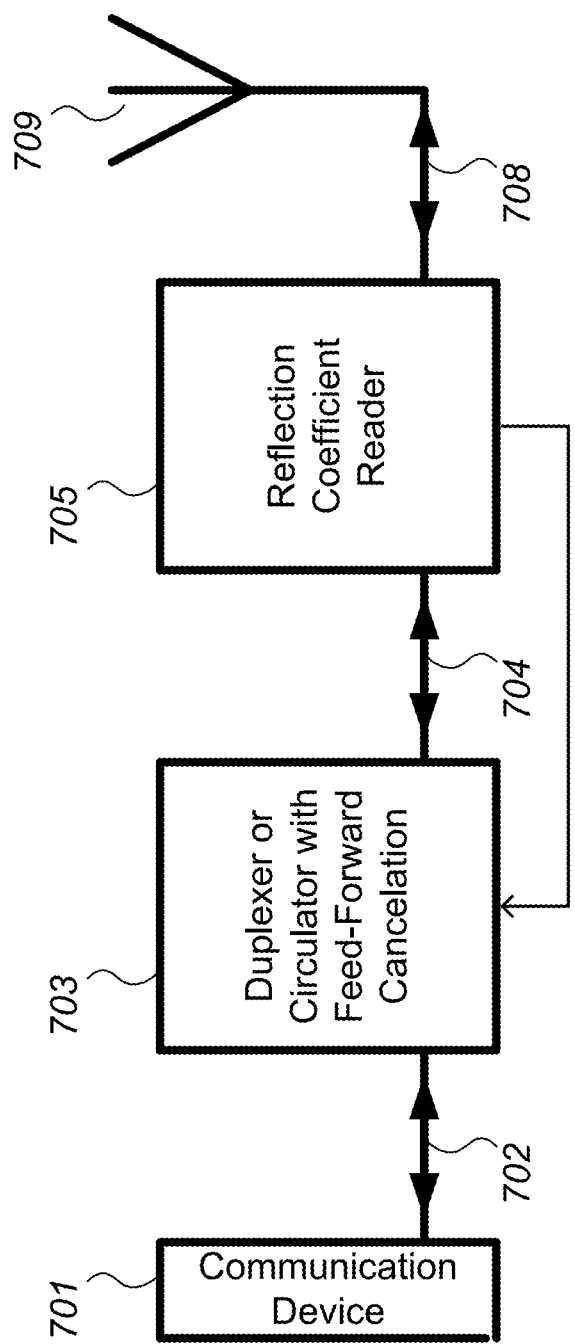
FIG. 7 illustrates one possible use of the reflection coefficient reader.

FIG. 7 illustrates one possible use of the disclosed reflection coefficient reader. The information from the reflection coefficient reader 705 can be used by the feed-forward cancelation circuit 703 to provide optimal cancelation of the reflected TX signal. The reflection coefficient reader 705 may be substantially the same as the reflection coefficient reader 210 in FIG. 2A or the reflection coefficient reader 311 in FIG. 3, for example.

Figure 8:
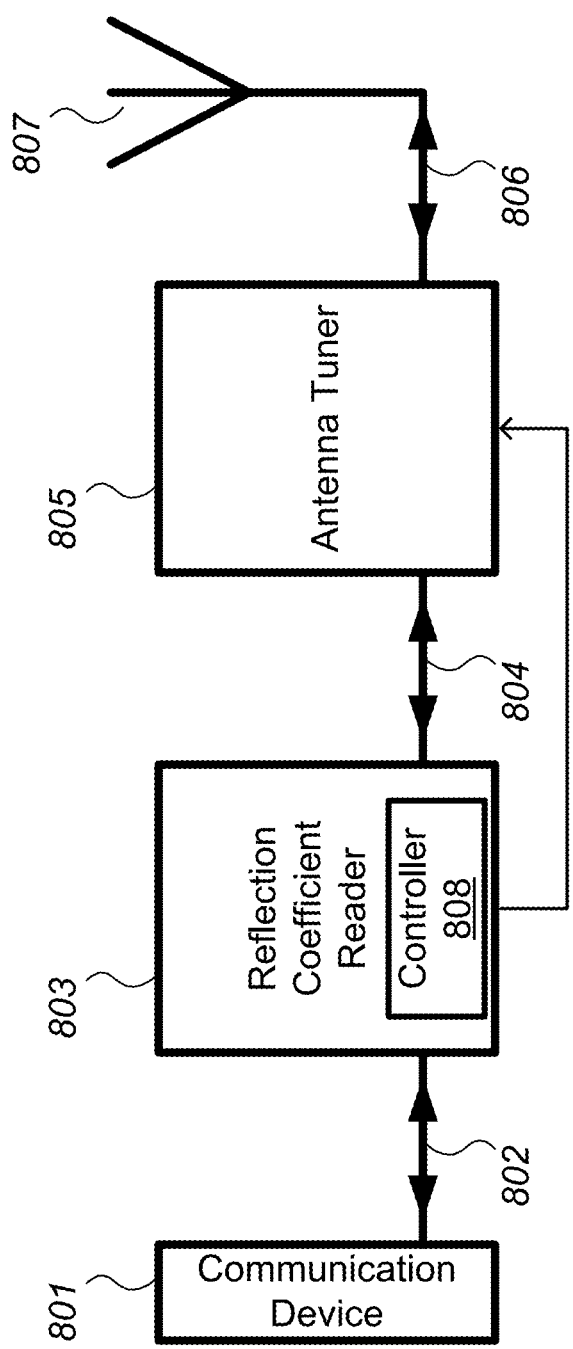
FIG. 8 illustrates another possible use of the reflection coefficient reader.

FIG. 8 illustrates one possible use of the disclosed reflection coefficient reader. A reflection coefficient reader 803 may be placed between a communication device 801 and an antenna tuner 805. The antenna tuner 805 can use the information from the reflection coefficient reader 803 to improve the impedance match between the communication device 801 and the antenna tuner 805. The reflection coefficient reader 803 may be substantially the same as the reflection coefficient reader 210 in FIG. 2A or the reflection coefficient reader 311 in FIG. 3, for example. In this configuration, the controller 808 of the reflection coefficient reader 803 can be programmed slightly differently as the objective is to achieve a good impedance match between the communication device 801 and the antenna tuner 805. So when the antenna tuner 805 has found a good match, the reflection coefficient reader 803 should not be able to find a reflection coefficient, or in other words, Γ=0. This is the optimal point. When the impedance of the antenna 807 changes, the current configuration of the antenna tuner 805 will not provide a good match between points 802 and 804. At this time, the reflection coefficient reader 803 will sense and find a reflection coefficient, which the antenna tuner could use to tune to a new point to achieve a good match between the antenna 807 and the communication device 801. The same scheme may be applied to a radar, for example.

Figure 9:
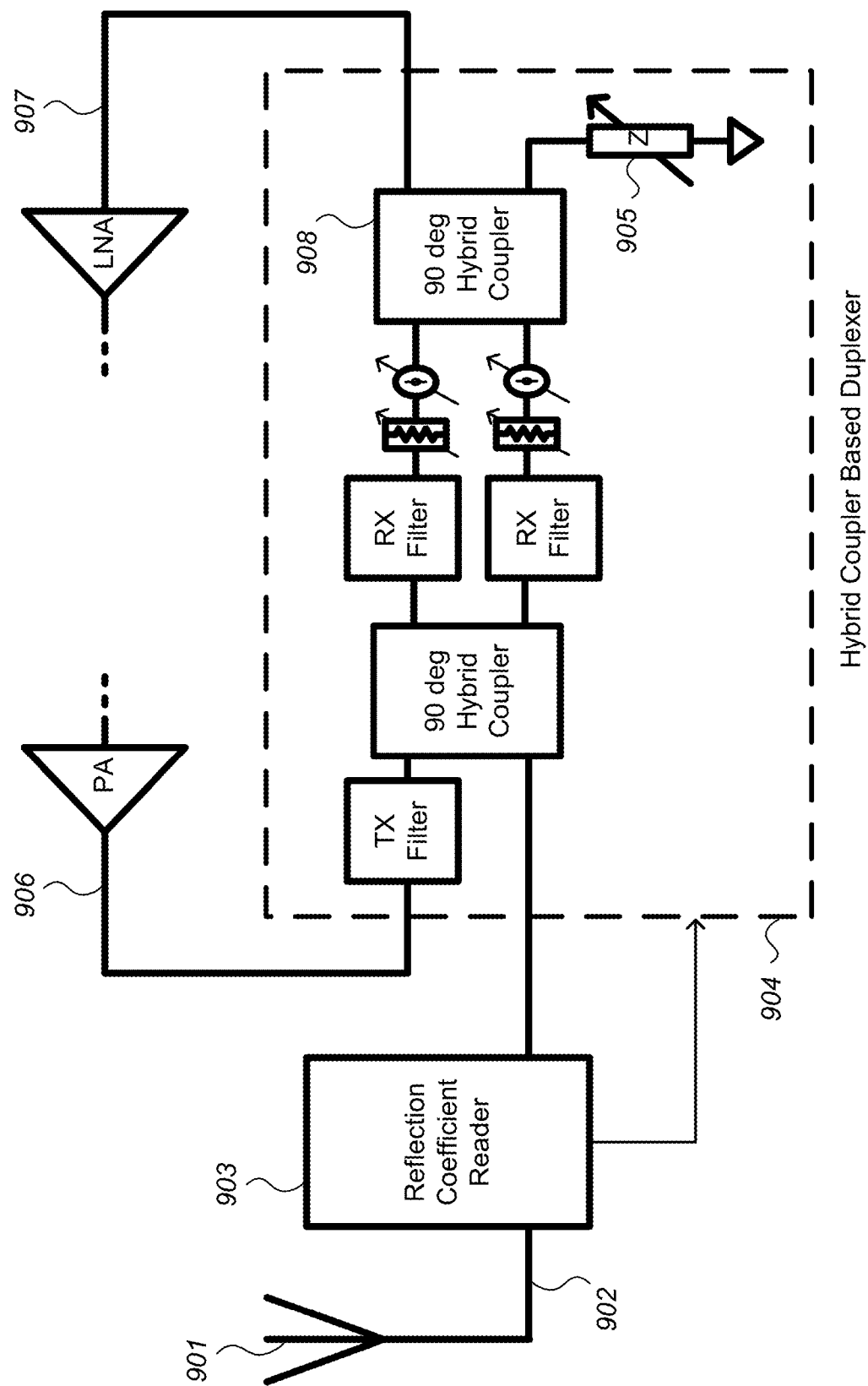
FIG. 9 illustrates a third possible use of the reflection coefficient reader.

FIG. 9 illustrates another possible use of the disclosed reflection coefficient reader. A wireless device can use a hybrid coupler based duplexer 904. In this case, the hybrid coupler 908 can use a variable impedance 905 to improve the isolation between transmit signal 906 and receive signal 907. The optimal impedance for the variable impedance 905 is directly related to the impedance of the antenna 901, which can be deduced from the reflection coefficient reader 903. The reflection coefficient reader 903 may be substantially the same as the reflection coefficient reader 210 in FIG. 2A or the reflection coefficient reader 311 in FIG. 3, for example.

Figure 10:
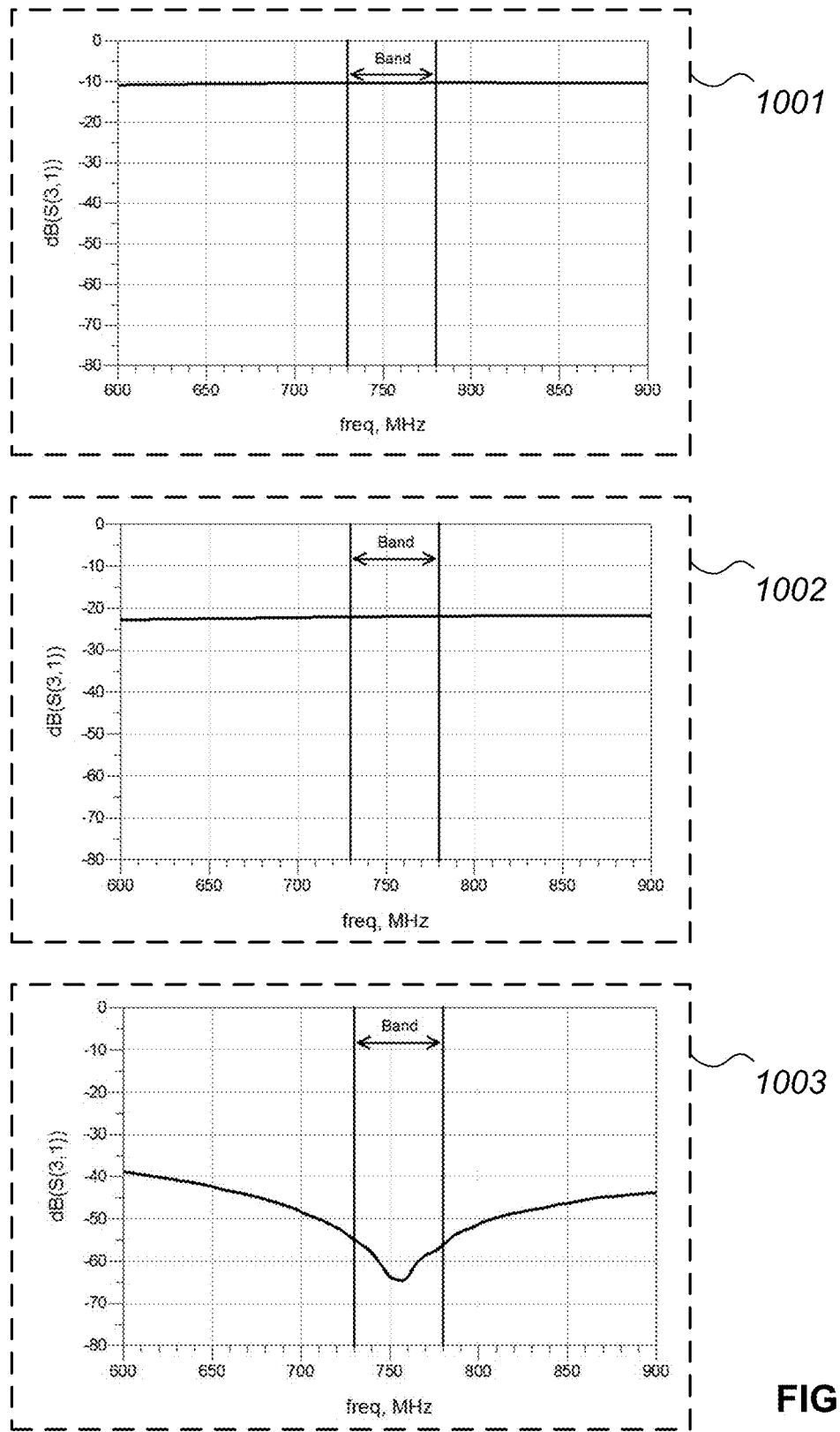
FIG. 10 illustrates graphs of the method in action.

FIG. 10 illustrates three graphs showing the reflection coefficient reader in action. Each graph shows the amount of signal that reaches the detector. In this example, the band of interest is from 730 MHz to 780 MHz, for example. A filter can be placed in front of the detector so the detector only detects energy in the band. However, the graphs show the results without the filter.

In first graph 1001, the phase and the attenuator are at their initial values. Graph 1002 shows the energy at the detector after step 402 of FIG. 4 is completed. Graph 1003 shows the energy of the signal at the detector after step 403 is completed.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a reflection coefficient reader.

Accordingly, aspects of the present disclosure may be realized in hardware, software, or a combination of hardware and software. The present disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

Aspects of the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A radio frequency (RF) circuitry, comprising:
    a device configured to tap a transmission line and to pick up some of electromagnetic signals traveling in both directions on the transmission line;
    controllable signal conditioning circuitry configured to condition a portion of a tapped signal that corresponds to the electromagnetic signals traveling in a first direction on the transmission line;
    a combiner configured to combine the conditioned portion of the tapped signal with a portion of the tapped signal that corresponds to the electromagnetic signal travelling in a second direction on the transmission line;
    a filter configured to operate on the combined signal;
    a detector configured to receive the filtered signal; and
    a controller configured to adjust the controllable signal conditioning circuitry based on information from an output of the detector such that the output of the detector reaches a desired minimum signal level.

2. The RF circuitry of claim 1, wherein the device comprises a directional coupler.

3. The RF circuitry of claim 1, wherein the controllable signal conditioning circuitry comprises a variable phase-shifter and a variable attenuator.

4. The RF circuitry of claim 1, wherein the detector includes one or more of a power detector, a voltage detector, and a current detector.

5. The RF circuitry of claim 1, wherein the controller comprises a digital circuit.

6. The RF circuitry of claim 1, wherein the controller comprises analog circuits and digital circuits.

7. The RF circuitry of claim 1, wherein the controller comprises a lookup table.

8. A method for determining a reflection coefficient, the method comprising:
    determining, by radio frequency (RF) circuitry, a phase of a phase-shifter in the RF circuitry so that a signal level at an output of a detector in the RF circuitry is minimized, wherein the RF circuitry comprises:
        a device configured to tap a transmission line and to pick up some of electromagnetic signals traveling in both directions on the transmission line;
        controllable signal conditioning circuitry configured to condition a portion of a tapped signal that corresponds to the electromagnetic signals traveling in a first direction on the transmission line, wherein the controllable signal conditioning circuitry comprises the phase-shifter and an attenuator;
        a combiner configured to combine the conditioned portion of the tapped signal with a portion of the tapped signal that corresponds to the electromagnetic signal travelling in a second direction on the transmission line;
        a filter configured to operate on the combined signal;
        the detector configured to receive the filtered signal; and
        a controller configured to adjust the controllable signal conditioning circuitry based on information from the output of the detector such that the output of the detector reaches a desired minimum signal level;
    determining an attenuation of the attenuator so that the signal level at the output of the detector is minimized;
    determining a phase and an amplitude of a reflection coefficient using the determined phase of the phase-shifter and the determined attenuation of the attenuator;
    outputting values of the reflection coefficient comprising the determined phase and the determined amplitude; and
    monitoring the signal level at the output of the detector, wherein if the monitored signal level increases, repeating the method beginning with the step of determining the phase of the phase-shifter so that the signal level at the output of the detector is minimized.

9. The method of claim 8, wherein if the monitored signal level decreases, maintaining the previous output value of the reflection coefficient.

10. The method of claim 8, wherein if the monitored signal level decreases, outputting the same output value of the reflection coefficient.

11. The method of claim 8, further comprising using a lookup table to provide a more accurate result for the determined values of the reflection coefficient.

12. The method of claim 8, wherein the detector includes one or more of a power detector, a voltage detector, and a current detector.

13. The method of claim 8, wherein the controllable signal conditioning circuitry comprises an equalizer that comprises the phase-shifter and the attenuator.

* * * * *